US011444637B2

(12) United States Patent
Zhang et al.

(10) Patent No.: US 11,444,637 B2
(45) Date of Patent: Sep. 13, 2022

(54) SELF-ADAPTIVE LOW-DENSITY PARITY CHECK HARD DECODER

(71) Applicant: SK hynix Inc., Icheon-Si (KR)

(72) Inventors: Fan Zhang, San Jose, CA (US); Chenrong Xiong, San Jose, CA (US); Xuanxuan Lu, San Jose, CA (US)

(73) Assignee: SK hynix Inc., Icheon-si (KR)

(*) Notice: Subject to any disclaimer, the term of this patent is extended or adjusted under 35 U.S.C. 154(b) by 453 days.

(21) Appl. No.: 16/566,639

(22) Filed: Sep. 10, 2019

(65) Prior Publication Data

US 2021/0075443 A1    Mar. 11, 2021

(51) Int. Cl.
| | |
|---|---|
| *H03M 13/11* | (2006.01) |
| *G06F 3/06* | (2006.01) |
| *G11C 16/04* | (2006.01) |
| *G11C 16/08* | (2006.01) |
| *G11C 16/34* | (2006.01) |
| *G11C 11/56* | (2006.01) |

(52) U.S. Cl.
CPC ....... *H03M 13/1105* (2013.01); *G06F 3/0619* (2013.01); *G06F 3/0659* (2013.01); *G06F 3/0679* (2013.01); *G11C 16/0483* (2013.01); *G11C 16/08* (2013.01); *G11C 16/349* (2013.01); *G11C 11/5621* (2013.01); *G11C 11/5671* (2013.01)

(58) Field of Classification Search
CPC .... G06F 3/0619; G06F 3/0659; G06F 3/0679; G06F 11/1004; G11C 16/08; G11C 16/349; G11C 16/0483; G11C 16/26; G11C 16/3418

See application file for complete search history.

(56) References Cited

U.S. PATENT DOCUMENTS 8,312,354 B1 * 11/2012 Varnica ............ H03M 13/2957
714/780
8,874,852 B2  10/2014 Ghai et al.
(Continued)

OTHER PUBLICATIONS

J. Hsieh, C. Chen and H. Lin, "Adaptive ECC Scheme for Hybrid SSD's," in IEEE Transactions on Computers, vol. 64, No. 12, pp. 3348-3361, Dec. 1, 2015, doi: 10.1109/TC.2015.2401028. (Year: 2015).*

*Primary Examiner* — Ramon A. Mercado
(74) *Attorney, Agent, or Firm* — Perkins Coie LLP

(57) ABSTRACT

Disclosed are methods, systems and devices for decoding data read from a memory device, including receiving noisy data from a first memory location included in a word line zone of the memory device, identifying the word line zone and a prior successful decoder parameter associated with the word line zone, decoding the noisy data using the prior successful decoder parameter used in a prior successful decoding with respect to a second memory location included in the same word line zone, determining whether the decoding based on the prior successful decoder parameter has succeeded, maintaining, upon a determination that the decoding has succeeded, the prior successful decoder parameter as a decoder parameter for the first memory location, and decoding, upon a determination that the decoding operation has failed, the noisy data read from the first memory location by using another decoder parameter selected from a set of predefined decoder parameters.

19 Claims, 9 Drawing Sheets

(56) References Cited

U.S. PATENT DOCUMENTS

| | | | | |
|---|---|---|---|---|
| 9,009,565 | B1* | 4/2015 | Northcott | G06F 11/1012 714/763 |
| 2009/0150746 | A1* | 6/2009 | Chaichanavong | H03M 13/13 714/752 |
| 2011/0264843 | A1* | 10/2011 | Haines | G06F 12/0246 711/170 |
| 2013/0024609 | A1* | 1/2013 | Gorobets | G06F 3/0611 711/E12.008 |
| 2014/0095956 | A1* | 4/2014 | Ozdemir | G11C 29/42 714/755 |
| 2015/0043277 | A1* | 2/2015 | Fitzpatrick | G06F 3/0616 365/185.11 |
| 2015/0242143 | A1* | 8/2015 | Kim | G11C 16/349 714/704 |
| 2017/0004040 | A1* | 1/2017 | Chinnakkonda Vidyapoornachary | G06F 3/0619 |
| 2017/0024163 | A1* | 1/2017 | Zhang | G06F 3/0616 |
| 2018/0191381 | A1* | 7/2018 | Achtenberg | H03M 13/3707 |

* cited by examiner

US 11,444,637 B2

SELF-ADAPTIVE LOW-DENSITY PARITY CHECK HARD DECODER

TECHNICAL FIELD

This patent document relates to semiconductor memories and data storage devices including the semiconductor memories.

BACKGROUND

With the increasing demand for large-capacity data storage devices semiconductor manufacturers continue to develop new technologies that enable high-capacity data storage devices, including three-dimensional (3D) flash memory stacking technology, which stacks multiple memory cell layers vertically, and multi-level cell (MLC) programming technology, which enables each memory cell to store two or more bits of information.

The increase in the number of bits each memory cell stores and the increase in the density of the array of the memory cells, however, may make the data storage devices more prone to errors due to dense threshold voltage distributions of the MLC memory cells and the interference between adjacent memory cells in the dense memory array. Information that is read from such a high-capacity data storage device is often processed by an error correction code (ECC) decoder to correct errors that may be introduced into stored information.

SUMMARY

Embodiments of the disclosed technology provide methods and systems to, among other features and benefits, self-adapt low-density parity check (LDPC) decoder parameters based on operating conditions and physical locations of data in a memory device.

In an embodiment of the disclosed technology, a method of decoding data read from a memory device includes receiving noisy data from a first memory location included in a physical location zone of the memory device, identifying the physical location zone and a prior successful decoder parameter associated with the identified physical location zone, decoding the noisy data read from the first memory location using the prior successful decoder parameter used in a prior successful decoding with respect to a second memory location included in the same physical location zone, determining whether the decoding using the prior successful decoder parameter has succeeded, maintaining, upon a determination that the decoding has succeeded, the prior successful decoder parameter as a decoder parameter for the first memory location, and decoding, upon a determination that the soft decoding operation has failed, the noisy data read from the first memory location by using another decoder parameter selected from a set of predefined decoder parameters.

In another embodiment of the disclosed technology, a method of setting a decoder parameter for decoding data read from a memory device includes dividing the memory device into a plurality of word line zones, obtaining a list of decoder parameter settings produced for correcting erroneous symbols in data read from memory locations included in the word line zone of the memory device, decoding, upon receipt of a read command requesting a read operation on a memory cell included in the word line zone, the data read from the memory cell using one of the decoder parameter settings in the list, determining whether the decoder parameter setting used has succeeded in decoding noisy data read from the memory cell of the word line zone of the memory device, and storing, upon a determination that a successful decoding is achieved, the decoder parameter setting that resulted in successful decoding.

In yet another embodiment of the disclosed technology, a system includes a non-transitory computer readable medium to store instructions thereon, and a processor in communication with the non-transitory computer readable medium, wherein the instructions upon execution by the processor cause the processor to receive noisy data from a first memory location included in a word line zone of a memory device, identify the word line zone and a prior successful decoder parameter associated with the identified word line zone, decode the noisy data read from the first memory location using the prior successful decoder parameter used in a prior successful decoding with respect to a second memory location included in the same word line zone, determine whether the decoding using the prior successful decoder parameter has succeeded, maintain, upon a determination that the decoding has succeeded, the prior successful decoder parameter as a decoder parameter for the first memory location, and decode, upon a determination that the decoding operation has failed, the noisy data read from the first memory location by using another decoder parameter selected from a set of predefined decoder parameters.

The subject matter described in this patent document can be implemented in specific ways that provide one or more of the following features.

DETAILED DESCRIPTION

Figure 1:
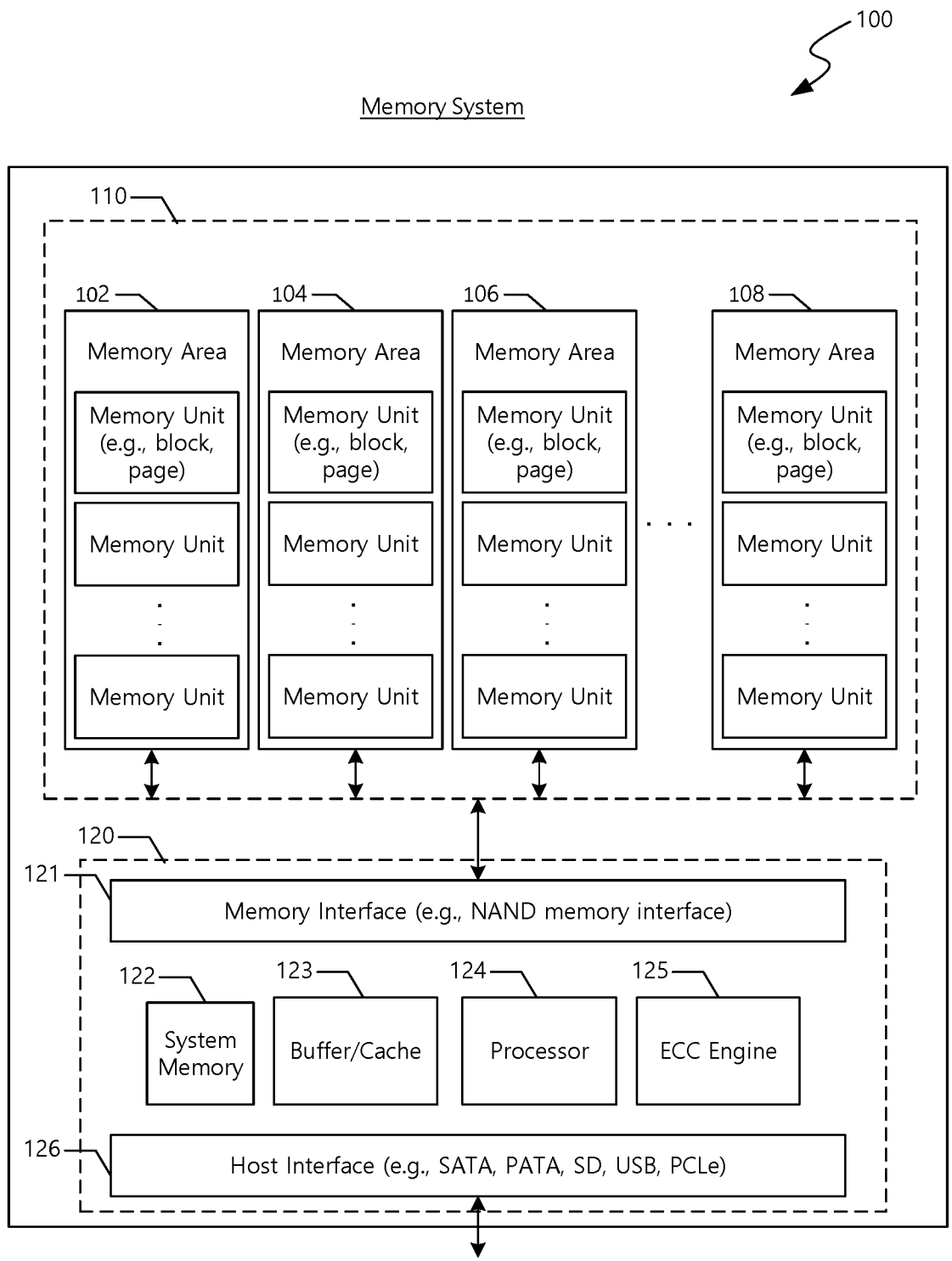
FIG. 1 illustrates an example of a memory system implemented based on some embodiments of the disclosed technology.

FIG. 1 illustrates an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
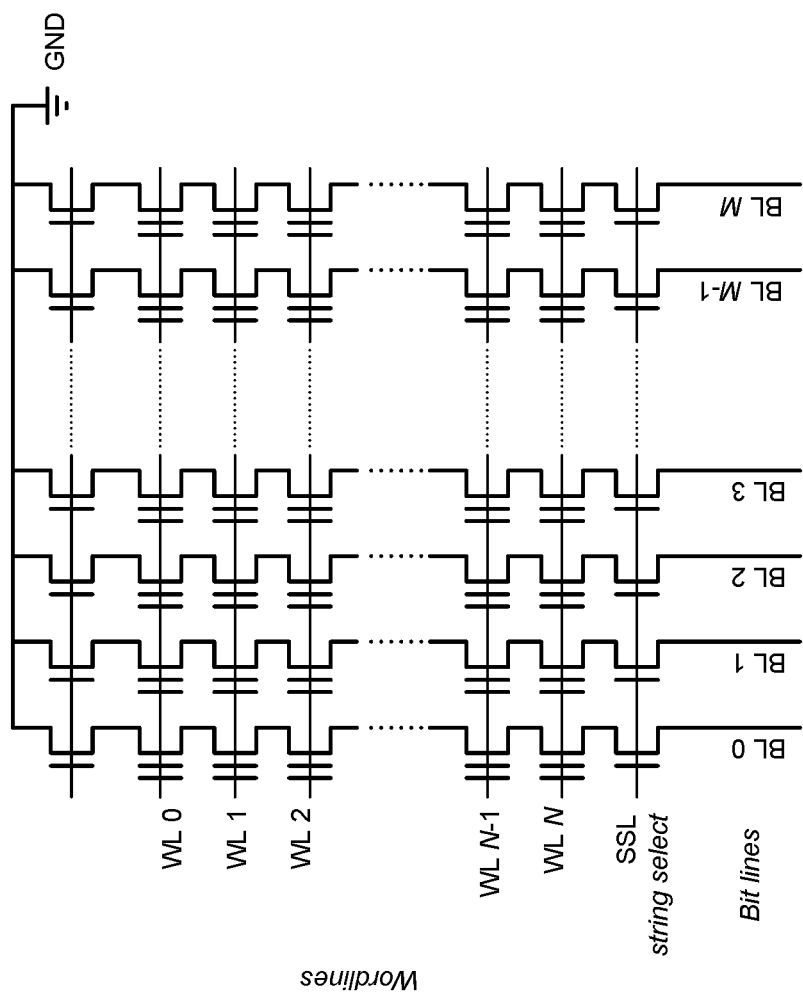
FIG. 2 illustrates an example of a memory cell array implemented based on some embodiments of the disclosed technology.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
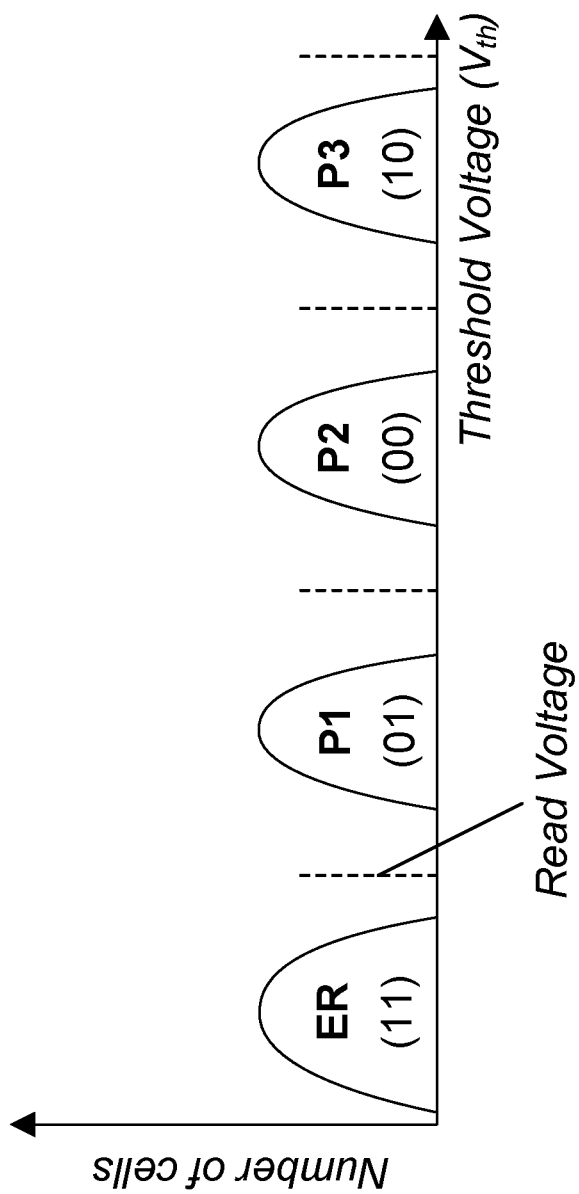
FIG. 3 illustrates an example of threshold voltage distribution curves in a multi-level cell device, wherein the number of cells for each program/erase state is plotted as a function of the threshold voltage.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
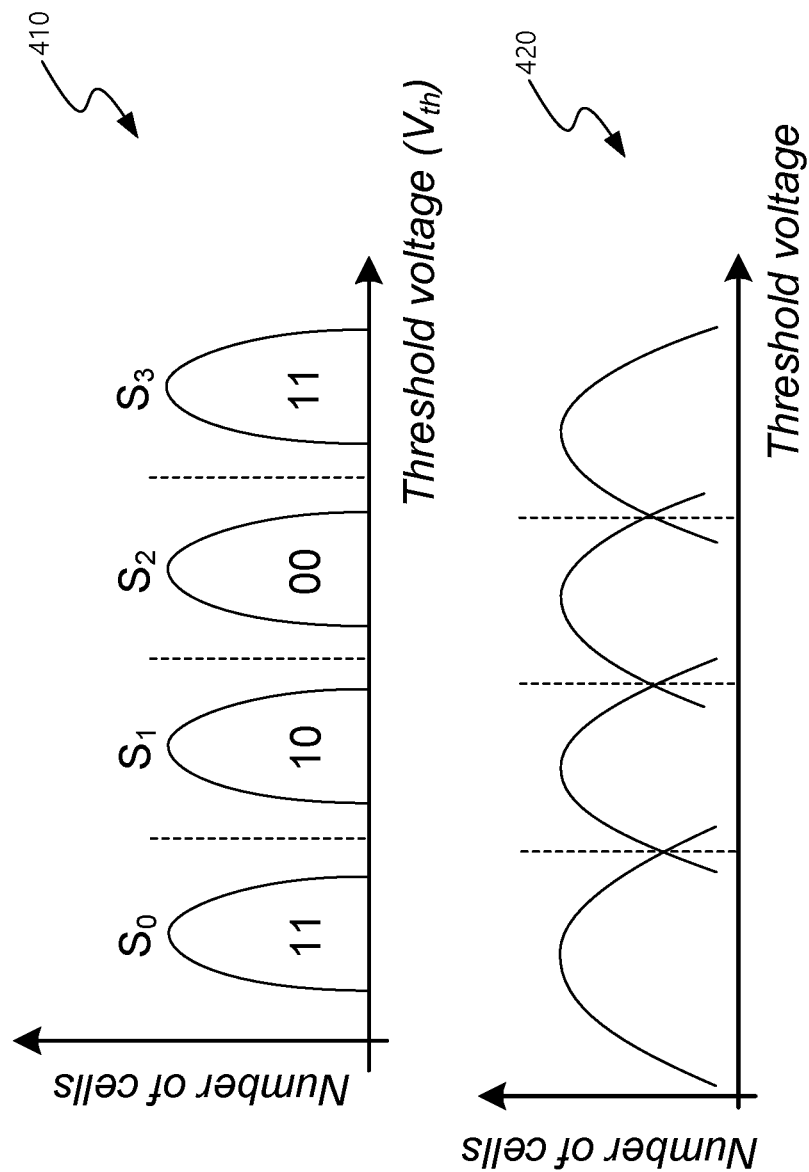
FIG. 4 illustrates an example of ideal threshold voltage distribution curves and an example of distorted threshold voltage distribution curves.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
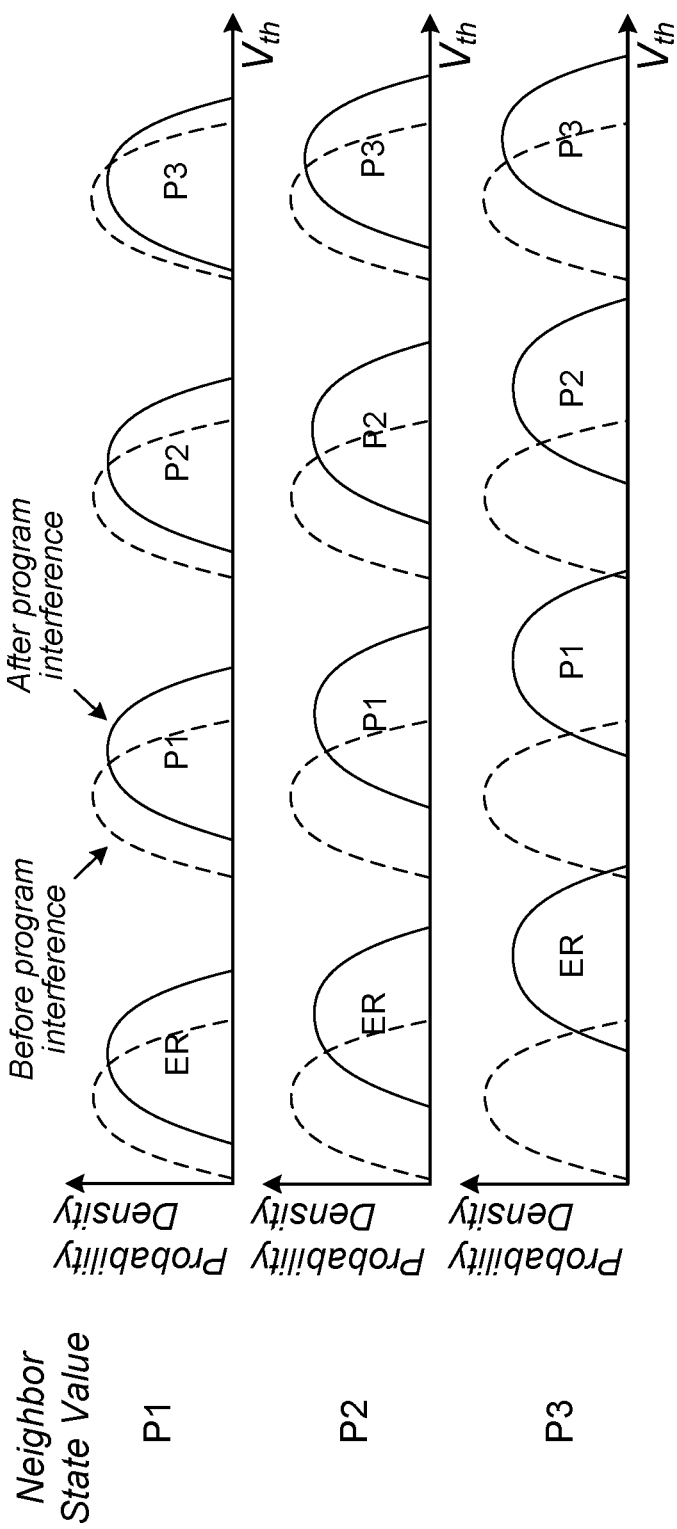
FIG. 5 illustrates an example of a cell-to-cell interference in NAND flash memory. The cell-to-cell interference can also cause threshold voltages of flash cells to be distorted.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell inference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
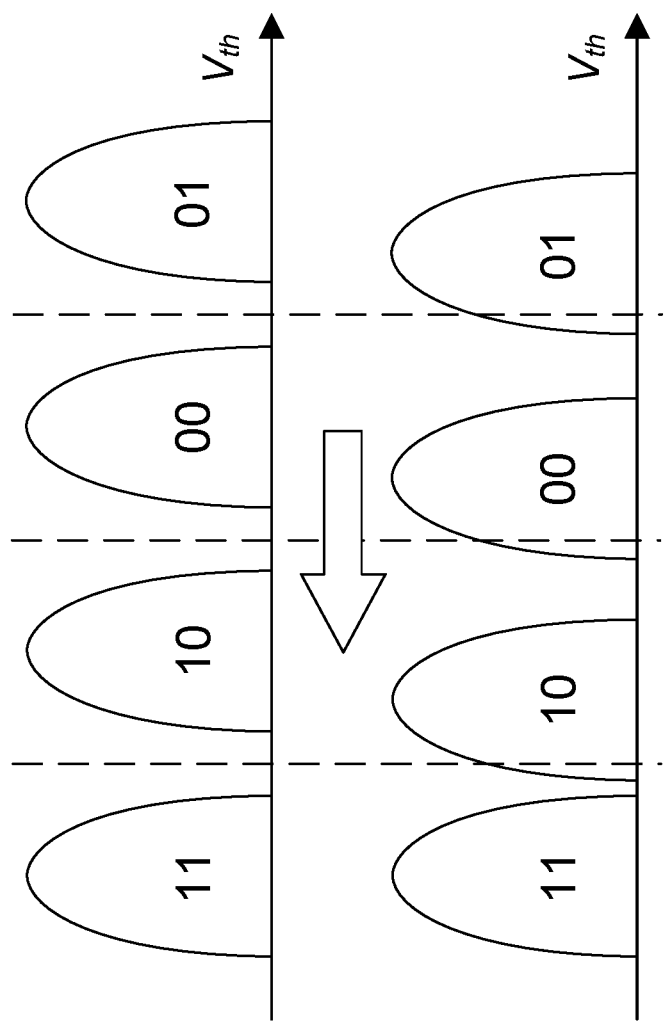
FIG. 6 illustrates an example of a retention error in NAND flash memory by comparing normal threshold-voltage distribution and shifted threshold-voltage distribution.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

As flash memories get older, the cell voltage distribution of flash memory pages starts to have a large variation depending on the operating conditions such as read disturbance, retention, and physical location. In an example implementation, ECC decoders have static decoder parameter settings, which do not adapt to the current operating conditions. As a result, the risk of data corruption increases, and the long decoding latency may deteriorate the quality of service (QoS) and energy efficiency. In another implementation, a look-up table can be used to predict the best decoder setting based on the flash memory operating conditions and physical location of the data. However, such a look-up table requires a large memory capacity to store a large amount of predefined optimal decoder settings for each memory location.

In some embodiments of the disclosed technology, LDPC hard decoders decode read-out data using a plurality of decoding parameters, including, but not limited to, log likelihood ratio (LLR) scaling, iteration control, initial LLR, LLR dampening scaling factor, and checksum thresholds. The decoder implemented based on some embodiments of the disclosed technology may decode the read-out data using an optimal decoder setting, which is determined based on flash memory operating conditions, including, but not limited to, program/erase counts (PEC), data retention and read disturbance (SPRD) of the data being decoded, and operating temperature.

In some embodiments of the disclosed technology, the LDPC decoder may self-adapt decoder parameters based on physical locations of data in a memory device. In some embodiments of the disclosed technology, the performance of the LDPC decoder may be improved by using optimal decoding settings for different memory locations.

In the context of this patent document, the words optimal, optimized or optimum that are used in conjunction with decoding settings or the memory system performance are used to indicate a decoder setting that provides a better performance for the memory device (e.g., higher reliability, better QoS, etc.) than other decoder settings. In this sense, the words optimum, optimized or optimal may or may not convey the best possible performance achievable by the memory device.

In some embodiments of the disclosed technology, a decoder can self-adapt the decoder parameters as the environment changes, based on the operating condition and physical location of the memory location being accessed, without requiring a look-up table with a large amount of predefined optimal decoder settings.

In some embodiments of the disclosed technology, each physical memory block is divided into portions, with each portion being assigned one of a finite set of predefined decoder parameters. The decoder can decode data read from the memory location using the finite set of predefined decoder parameters assigned to the memory location. In some embodiments of the disclosed technology, the decoder may utilize prior successful decoder settings to decode the current read-out data upon a determination that the memory cell currently being accessed belongs to the memory portion associated with the prior successful decoder settings. If the prior successful decoder settings fail to successfully decode the data read from the memory portion, a different set of decoder parameters is selected to decode that memory portion.

A data storage device can be made up of a plurality of memory chip dies, each including a plurality of physical memory blocks. Each physical memory block includes a plurality of memory cells, and each memory cell can be selected by a word line coupled thereto. In some embodiments of the disclosed technology, each physical memory block is divided into a plurality of word line zones. The word line zones are divided based on their physical locations in a memory chip die or a memory block. Each word line zone includes a plurality of memory cells coupled to a plurality of word lines arranged in the same physical portion of the memory chip die or the memory block. In some embodiments of the disclosed technology, the decoder can decode data read from the word line zone using a finite set of predefined decoder parameters assigned to the memory location. The decoder may utilize prior successful decoder settings to decode the current read-out data upon a determination that the memory cell currently being accessed belongs to the word line zone associated with the prior successful decoder settings.

Figure 7:
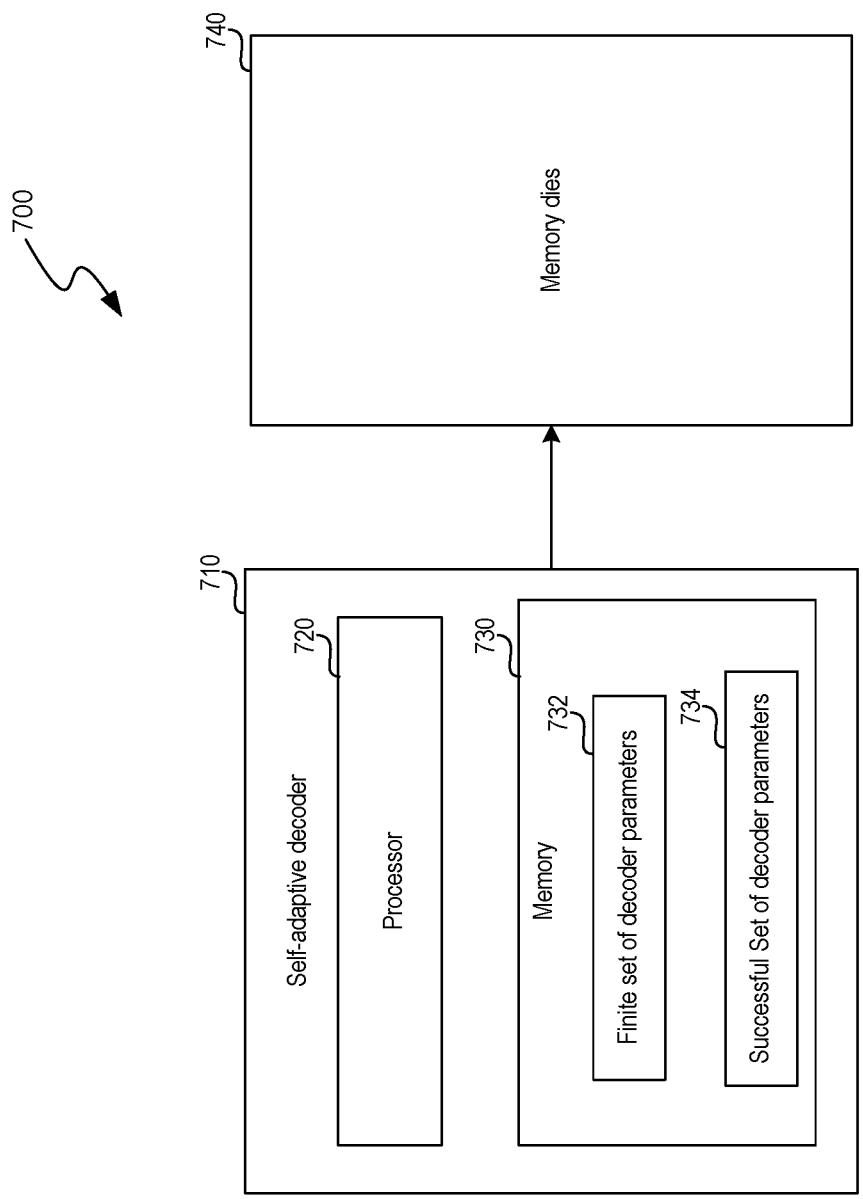
FIG. 7 illustrates an example of data storage device that utilizes error correction code (ECC) based on some embodiments of the disclosed technology.

FIG. 7 illustrates an example of data storage device 700 that utilizes error correction code (ECC) based on some embodiments of the disclosed technology. The data storage device 700 may include a self-adaptive decoder 710 and a plurality of memory dies 740. The self-adaptive decoder 710 may include a processor 720 and a memory 730. The memory 730 is configured to store a finite set of decoder parameters 732 and a successful decoder parameter 734.

Some examples of the data storage device 700 include a solid-state drive (SSD), which is a data storage device that utilizes non-volatile memories (e.g., flash memory) and/or volatile memories (e.g., synchronous dynamic random access memory; SDRAM) to store data. For example, the data storage device 700 may include a plurality of flash memory devices using multi-level cell technology. Each memory device includes a plurality of memory blocks, and each of the plurality of memory block includes a plurality of memory cells. Each memory cell can be programmed into one of a plurality of program states. The data stored in each memory cell can be read out using a plurality of read thresholds. The data storage device implemented based on some embodiments of the disclosed technology is configured to ensure that the data can be decoded using optimized decoder parameters.

The data storage device 700 may include an error correction code (ECC) engine that is configured to receive data to be written to the plurality of memory dies 740 and to generate a codeword. For example, the ECC engine may include an encoder configured to encode data using error correction codes such as a low-density parity check (LDPC) encoder.

The ECC engine may also be configured to receive data and to process the received data using the error correction codes such as the LDPC decoder. The LDPC decoder may be configured to decode data read from the plurality of memory dies 740 to detect and correct, up to an error correction capability of the ECC scheme, one or more bits of errors that are present in the data. In some implementations, the processor 720 may include the ECC engine.

The processor 720 may be operable to find an optimal set of decoder parameters based on the physical location of the memory cell being accessed. In some embodiments of the disclosed technology, the processor 720 may be operable to find the optimal set of decoder parameter based on the word line zone the memory cell belongs to. In some embodiments of the disclosed technology, the memory 730 may be operable to store a successful decoder parameter for each word line zone (e.g., a set of decoder parameters that was used when a prior decoding on the corresponding word line zone was successful).

Upon receipt of a read request and the associated read address, the processor 720 finds the word line zone corresponding to the read address and fetches the successful decoder parameters associated with that word line zone. The processor 720 decodes data read out from the memory cell of the word line zone, using the successful decoder parameters corresponding to the word line zone.

If the decoding is successfully completed, the processor 720 may store the successful decoder parameters as the optimal decoder parameters for that word line zone. If the decoding fails, the processor 720 decodes the data using the finite set of predefined decoder parameters. When the data is successfully decoded using one of the finite set of predefined decoder parameters, the processor 720 store the decoder parameters in the memory 730 as the optimal decoder parameters.

Figure 8:
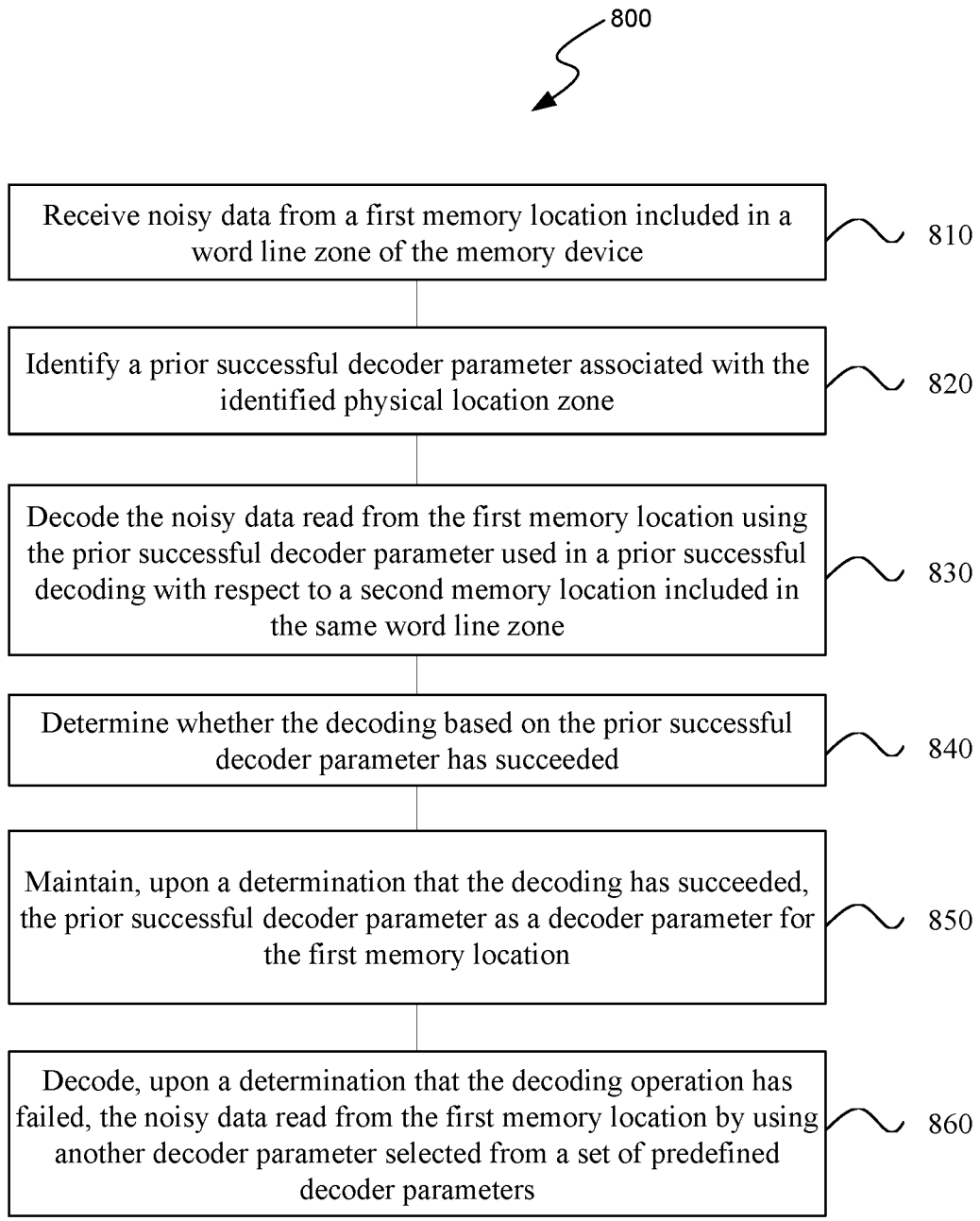
FIG. 8 is a flow diagram that illustrates an example of a method of decoding noisy data read from a certain memory location based on some embodiments of the disclosed technology.

FIG. 8 is a flow diagram that illustrates an example of a method 800 of decoding noisy data read from a certain memory location based on some embodiments of the disclosed technology. The method 800 includes, at step 810, receiving noisy data (or noisy codeword) from a memory location that belongs to a word line zone. In an example, the noisy data is a data (or codeword) that has been corrupted due to one or more types of errors such as error caused by program and erase (P/E) cycle, cell-to-cell interference, data retention errors, and read disturbance.

The method 800 includes, at step 820, identifying the word line zone the memory location is included in. The method 800 may also include identifying and fetching one or more decoder parameters that were used to decode corrupted data in the prior successful decoding of any memory location included in the word line zone.

The method 800 includes, at step 830, decoding the noisy data read from the first memory location using the prior successful decoder parameter used in a prior successful decoding with respect to a second memory location included in the same word line zone. The prior successful decoding parameters of a second memory location can be used to decode data read from a second memory location if the second memory location and the first memory location are included in the same word line zone.

The method 800 includes, at step 840, determining whether the decoding based on the prior successful decoder parameter has succeeded. For example, the method 800 includes, at step 840, determining whether the one or more decoder parameters, which were used in the prior successful decoding to decode noisy data read from the first memory location of the word line zone, have succeeded in decoding the noisy data read from the second memory location of the word line zone.

The method 800 includes, at step 850, maintaining, upon a determination that the decoding has succeeded, the prior successful decoder parameter as a decoder parameter for the first memory location. For example, upon a determination that the decoding based on the one or more decoder parameters have succeeded, the one or more decoder parameters may be maintained as decoder parameters for the first memory location.

The method 800 includes, at step 860, decoding, upon a determination that the decoding operation has failed, the noisy data read from the first memory location by using another decoder parameter selected from a set of predefined decoder parameters. Upon a determination that the decoding based on the one or more decoder parameters have failed, the noisy data is decoded based on one or more decoder parameters within the finite set of predefined decoder parameters one-at-a-time until a successful decoding is achieved.

In some implementations, the word line zone includes memory cells that are coupled to a set of word lines grouped together based on physical locations of word lines in the memory device.

In some implementations, the word line zone is determined based on operating conditions of the first and second memory locations of the memory device, including at least one of program/erase counts of the first and second memory locations, data retention and read disturbance of the first and second memory locations, and an operating temperature of the first and second memory locations.

In some implementations, the word line zone is determined based on at least one of die indices, block indices, or word line indices.

In some implementations, the decoder parameter includes at least one of log likelihood ratio (LLR) scaling, iteration control, initial LLR, LLR dampening scaling factor, or checksum thresholds.

In some implementations, the set of predefined decoder parameters is determined based on memory device operating conditions including at least one of program/erase counts, data retention and read disturbance of the data being decoded, or operating temperature of the memory device.

In some implementations, decoding the noisy data read from the first memory location by using another decoder parameter selected from the set of predefined decoder parameters includes selecting a decoder parameter one at a time until the decoding succeeds.

Figure 9:
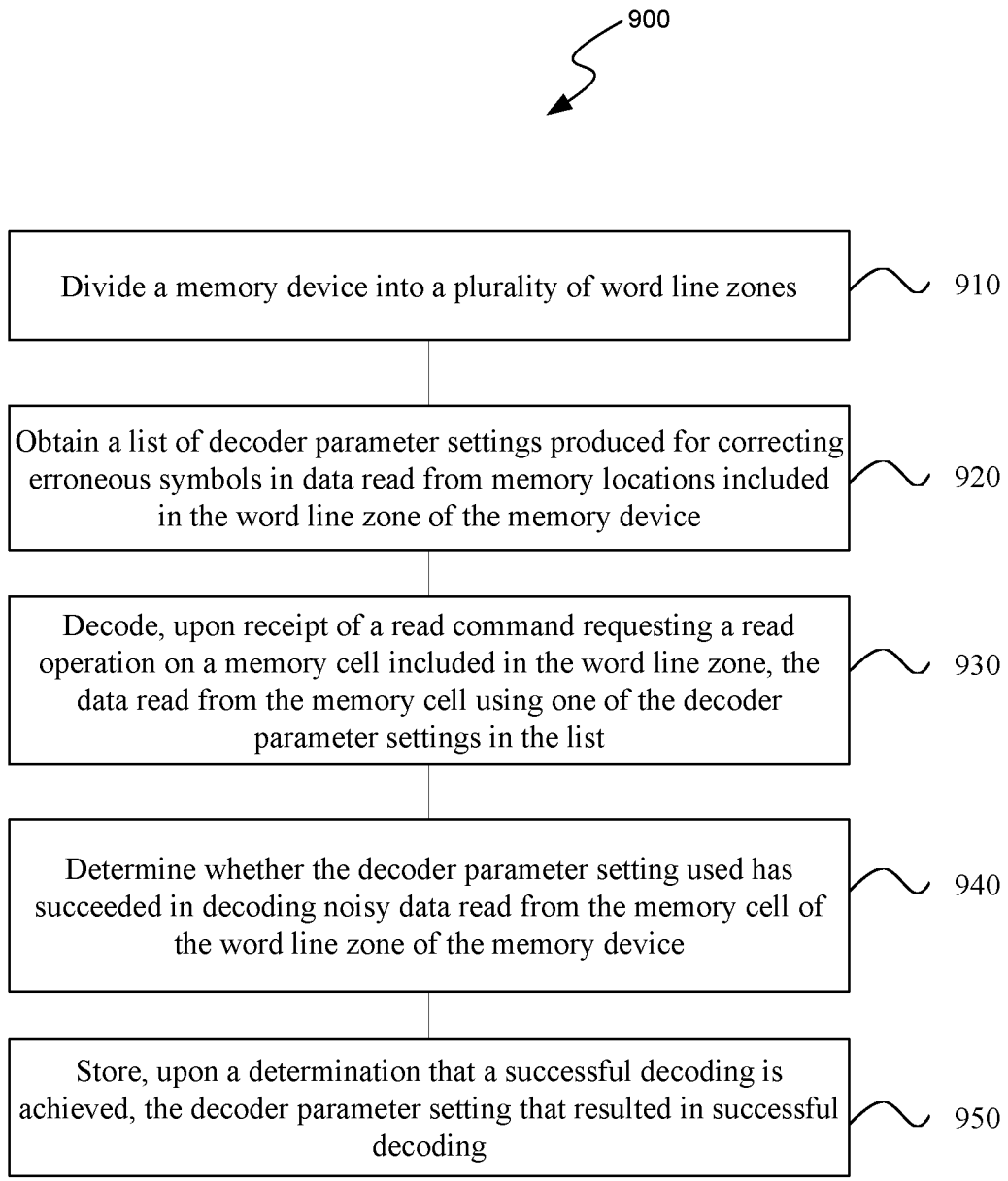
FIG. 9 is a flow diagram that illustrates an example of a method of setting decode parameter values based on some embodiments of the disclosed technology.

FIG. 9 is a flow diagram that illustrates an example of a method 900 of setting decode parameter values based on some embodiments of the disclosed technology. The method 900 includes, at step 910, dividing the memory device into a plurality of word line zones. In some implementations, a 4-bit variable can be used to indicate the best decoder setting for each word line zone and page type. The variables can be initialized to a certain pre-defined value.

The method 900 includes, at step 920, obtaining a list of decoder parameter settings produced for correcting erroneous symbols in data read from memory locations included in the word line zone of the memory device. In an example, the erroneous bits may be introduced into read-out data due to excessive program and erase (P/E) cycles, cell-to-cell interference, data retention errors, and/or read disturbance.

Each decoder setting listed is labeled from 0 to L−1. In some implementations, 16 decoder settings are available. Each setting may be corresponding to certain decoder mode, such as low fail bit count (FB) mode, median FB high throughput mode, high FB high throughput mode, high FB high correction mode and others. Each decoder mode may be used to data storage devices in different product life cycle stages. The low FB mode may indicate that the number of erroneous bits in the data is low at the beginning of the life cycle of the data storage devices. The median FB high throughput mode may indicate that the number of erroneous bits in the data is higher than that in the low FB mode in the middle of the life cycle of the data storage devices. The high FB high throughput mode may indicate that the number of erroneous bits in the data is high at the end of the life cycle of the data storage devices where the devices are used as enterprise products. The high FB high correction mode may indicate that the data storage devices are at the end of the life cycle of the data storage devices for both enterprise and client products cases.

The method 900 includes, at step 930, decoding, upon receipt of a read command requesting a read operation on a memory cell included in the word line zone, the data read from the memory cell using one of the decoder parameter settings in the list. For example, the decoder setting with the 4-bit values indicating the best decoder setting may be used to decode the data. In some implementations, all the decoder setting in the list may be used to decode the data one-at-a-time until a successful decoding is achieved.

The method 900 includes, at step 940, determining whether the decoder parameter setting used has succeeded in decoding noisy data read from the memory cell of the word line zone of the memory device.

The method 900 includes, at step 950, storing, upon a determination that a successful decoding is achieved, the decoder parameter setting that resulted in successful decoding.

In some implementations, the decoder setting that was used to decode data in the previous successful decoding with respect to any memory cell in the same word line zone is stored in the memory and is used to decode data in a subsequent decoding with respect to the same, or any other memory cell in the same word line zone. If the subsequent decoding is successful, the decoder setting is maintained in the memory. If the subsequent decoding is not successful, the rest of the decoder settings in the list may be used to decode the data one by one until the decoding succeeds or fails. If the decoding succeeds with the i-th setting, the 4-bit variable is changed to "i."

The memory consumption is equal to 3×N×K, where N is the total number of physical blocks and K is the number of word line zones per block. Each memory die can include tens of thousands of blocks. If each block is partitioned into 8 word-line zones, the memory needed to store the decoder settings is around 150 KB. The memory consumption can be further reduced by creating block zones, i.e., grouping several adjacent blocks within a super block. If the number of blocks in a block zone is equal to B, the memory consumption is equal to (3×N×K)/B. With such a small memory footprint, the algorithm can be fully implemented in a system-on-chip (SoC).

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "processor" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

It is intended that the specification, together with the drawings, be considered exemplary only, where exemplary means an example. As used herein, the singular forms "a", "an" and "the" are intended to include the plural forms as well, unless the context clearly indicates otherwise. Additionally, the use of "or" is intended to include "and/or", unless the context clearly indicates otherwise.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method of decoding data read from a memory device, comprising:
    receiving noisy data from a first memory location included in a word line zone of the memory device, wherein the word line zone is one of a plurality of word line zones that are divided based on physical locations of the word lines in a memory chip die or a memory block;
    identifying the word line zone and a prior successful decoder parameter associated with the identified word line zone, among a list of decoder parameters for the identified word line zone;
    decoding the noisy data read from the first memory location using the prior successful decoder parameter used in a prior successful decoding with respect to a second memory location included in the same word line zone;
    determining whether the decoding based on the prior successful decoder parameter has succeeded;
    maintaining, upon a determination that the decoding has succeeded, the prior successful decoder parameter as a decoder parameter for the first memory location; and
    decoding, upon a determination that the decoding operation has failed, the noisy data read from the first memory location by using the decoder parameters on the list of decoder parameters, other than the prior successful decoding parameter, one by one until the decoding succeeds or the list is exhausted.

2. The method of claim 1, wherein the word line zone includes memory cells that are coupled to a set of word lines grouped together based on physical locations of word lines in the memory device.

3. The method of claim 1, wherein the word line zone is determined based on operating conditions of the first and second memory locations of the memory device, including at least one of program/erase counts of the first and second memory locations, data retention and read disturbance of the first and second memory locations, and an operating temperature of the first and second memory locations.

4. The method of claim 1, wherein the word line zone is determined based on at least one of die indices, block indices, or word line indices.

5. The method of claim 1, wherein the decoder parameter includes at least one of log likelihood ratio (LLR) scaling, iteration control, initial LLR, LLR dampening scaling factor, or checksum thresholds.

6. The method of claim 1, wherein the set of predefined decoder parameters is determined based on memory device operating conditions including at least one of program/erase counts, data retention and read disturbance of the data being decoded, or operating temperature of the memory device.

7. A method of setting a decoder parameter for decoding data read from a memory device, comprising:
dividing the memory device into a plurality of word line zones based on physical locations of word lines in a memory chip die or a memory block;
obtaining a list of decoder parameter settings produced for correcting erroneous symbols in data read from memory locations included in the word line zone of the memory device;
decoding, upon receipt of a read command requesting a read operation on a memory cell included in the word line zone, the data read from the memory cell using a first decoder parameter setting associated with the word line zone of the memory device, among the list of decoder parameter settings for the word line zone;
determining whether the first decoder parameter setting has succeeded in decoding noisy data read from the memory cell of the word line zone of the memory device;
storing, upon a determination that a successful decoding is achieved, the first decoder parameter setting that resulted in successful decoding; or
decoding, upon a determination that the decoding has failed, the noisy data read from the memory cell of the word line zone by the decoder parameter settings on the list of decoder parameter settings, other than the first decoder parameter setting, one by one until the decoding succeeds or the list is exhausted.

8. The method of claim 7, wherein the word line zone includes memory cells that are coupled to a set of word lines grouped together based on physical locations of word lines in the memory device.

9. The method of claim 7, wherein the word line zone is determined based on operating conditions of the first and second memory locations of the memory device, including at least one of program/erase counts of the first and second memory locations, data retention and read disturbance of the first and second memory locations, and an operating temperature of the first and second memory locations.

10. The method of claim 7, wherein the physical location zone is determined based on at least one of die indices, block indices, or word line indices.

11. The method of claim 7, wherein the decoder parameter includes at least one of log likelihood ratio (LLR) scaling, iteration control, initial LLR, LLR dampening scaling factor, or checksum thresholds.

12. The method of claim 7, wherein the list of decoder parameter settings is determined based on memory device operating conditions including at least one of program/erase counts, data retention and read disturbance of the data being decoded, or operating temperature of the memory device.

13. The method of claim 7, wherein determining whether a decoder parameter setting used has succeeded in decoding noisy data read from the memory cell included in the physical location zone of the memory device includes selecting a decoder parameter one at a time until the decoding succeeds.

14. A system, comprising:
a non-transitory computer readable medium to store instructions thereon; and
a processor in communication with the non-transitory computer readable medium, wherein the instructions upon execution by the processor cause the processor to:
receive noisy data from a first memory location included in a word line zone of a memory device, wherein the word line zone is one of a plurality of word line zones that are divided based on physical locations of the word lines in a memory chip die or a memory block;
identify the word line zone and a prior successful decoder parameter associated with the identified word line zone, among a list of decoder parameters for the identified word line zone;
decode the noisy data read from the first memory location using the prior successful decoder parameter used in a prior successful decoding with respect to a second memory location included in the same word line zone;
determine whether the decoding using the prior successful decoder parameter has succeeded;
maintain, upon a determination that the decoding has succeeded, the prior successful decoder parameter as a decoder parameter for the first memory location; and
decode, upon a determination that the decoding operation has failed, the noisy data read from the first memory location by using the decoder parameters on the list of decoder parameters, other than the prior successful decoding parameter, one by one until the decoding succeeds or the list is exhausted.

15. The system of claim 14, wherein the word line zone includes memory cells that are coupled to a set of word lines grouped together based on physical locations of word lines in the memory device.

16. The system of claim 14, wherein the word line zone is determined based on operating conditions of the first and second memory locations of the memory device, including at least one of program/erase counts of the first and second memory locations, data retention and read disturbance of the first and second memory locations, and an operating temperature of the first and second memory locations.

17. The system of claim 14, wherein the word line zone is determined based on at least one of die indices, block indices, or word line indices.

18. The system of claim 14, wherein the decoder parameter includes at least one of log likelihood ratio (LLR) scaling, iteration control, initial LLR, LLR dampening scaling factor, or checksum thresholds.

19. The system of claim 14, wherein the set of predefined decoder parameters is determined based on memory device operating conditions including at least one of program/erase counts, data retention and read disturbance of the data being decoded, or operating temperature of the memory device.

* * * * *